United States Patent [19]

Park

[11] Patent Number: 6,117,787
[45] Date of Patent: *Sep. 12, 2000

[54] PLANARIZATION METHOD FOR A SEMICONDUCTOR DEVICE

[75] Inventor: Jin-Won Park, Choongcheongbuk-Do, Rep. of Korea

[73] Assignee: LG Semicon Co., Ltd., Choongcheongbuk-Do, Rep. of Korea

[*] Notice: This patent issued on a continued prosecution application filed under 37 CFR 1.53(d), and is subject to the twenty year patent term provisions of 35 U.S.C. 154(a)(2).

[21] Appl. No.: 09/013,095

[22] Filed: Jan. 26, 1998

[30] Foreign Application Priority Data

Sep. 2, 1997 [KR] Rep. of Korea ............ 97-45517

[51] Int. Cl.[7] .............................. H01L 21/3056
[52] U.S. Cl. .................. 438/706; 438/710; 438/712; 438/720
[58] Field of Search .................. 438/689, 632, 438/626, 695, 697, 699, 700, 702, 703, 704, 706, 710

[56] References Cited

U.S. PATENT DOCUMENTS

| | | | |
|---|---|---|---|
| 4,782,037 | 11/1988 | Tomozawa et al. | 437/192 |
| 4,931,410 | 6/1990 | Tokunaga | 437/189 |
| 5,288,664 | 2/1994 | Mukai | 437/173 |
| 5,429,070 | 7/1995 | Campbell et al. | 118/723 R |
| 5,770,518 | 6/1998 | Shen | 438/631 |
| 5,843,836 | 12/1998 | Cheung et al. | 438/626 |
| 5,872,056 | 2/1999 | Manning | 438/637 |
| 5,968,610 | 10/1999 | Liu et al. | 427/579 |

OTHER PUBLICATIONS

S. Bothra, et al.; "Integration of a 5–Level 0.35 $\mu$m Backend Process Using HDP ECR Oxide"; DUMIC Conference Feb. 20–21, 1996; pp. 253–258.

*Primary Examiner*—Benjamin L. Utech
*Assistant Examiner*—Lan Vinh
*Attorney, Agent, or Firm*—Morgan, Lewis & Bockius LLP

[57] ABSTRACT

A method of planarizing a multilayer semiconductor wiring structure includes the steps of forming a planarization layer on a substrate, forming a first conductive line pattern over the planarization layer, forming an insulation layer over the first conductive line pattern and the planarization layer, forming holes in the insulation layer to selectively expose portions of a top surface of the first conductive line pattern, forming a second conductive line pattern over the insulation layer, over portions of the first conductive line pattern, selectively in contact with the first conductive layer through the holes, and filling the holes, and forming a passivation layer over the second conductive line pattern, wherein conductive lines of the first conductive line pattern have a width of less than approximately 2 $\mu$m.

27 Claims, 8 Drawing Sheets

PLANARIZATION METHOD FOR A SEMICONDUCTOR DEVICE

This application claims the benefit of Korean patent application No. 45517/1997, filed Sep. 2, 1997, which is hereby incorporated by reference.

BACKGROUND OF THE INVENTION

1. Field of the Invention

The present invention relates to a planarization method for a semiconductor device, and more particularly, to a planarization method for the semiconductor device that improves local and global flatness when manufacturing the semiconductor device.

2. Discussion of the Related Art

As semiconductor devices have become highly integrated, intervals between metal lines placed on the same layer have become narrower. Accordingly, manufacturing a semiconductor device with multiple-layer metal wiring becomes unavoidable. When forming the multiple-layer metal wiring, submicron intervals between the metal lines and between each layer of the metal lines should be filled in with an insulation material without any voids. In a photolithographic process, the margin of the depth of focus should be maintained by decreasing global topological differences over a wafer that occur due to a process of making a multiple-layer metal wiring.

Currently, in order to fill in a submicron interval between the lines, a plasma enhanced oxidation film is deposited, a spin-on-glass photoresist is coated thereon, and an etchback is performed. A method for depositing an oxidation film by a high density plasma chemical vapor deposition method (HDP CVD) has recently become widely used. In order to decrease the global topological differences, a polymer such as a photoresist or Accuflo™ (a product manufactured by Allied Signal Co.), is coated onto the wafer, and an etchback is performed. Also, a chemical mechanical polishing method (CMP) has also become widely used recently.

Figure 1A:
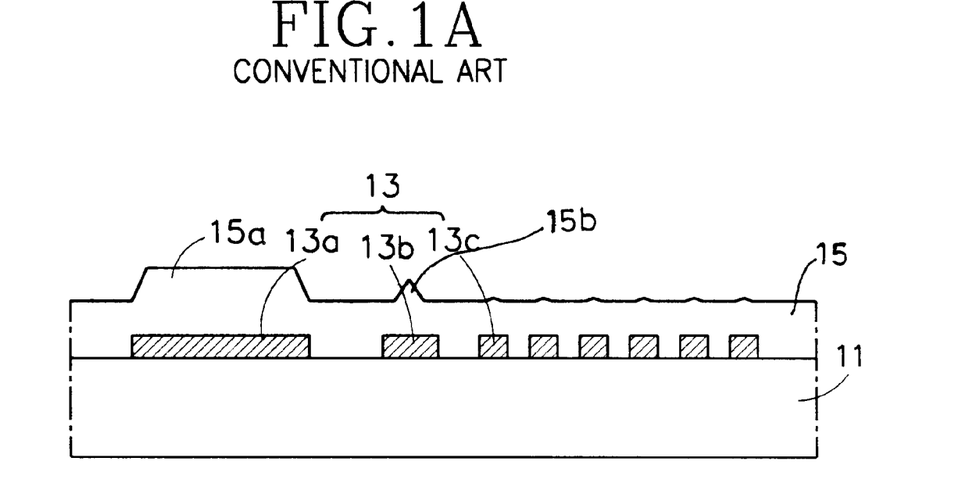
FIGS. 1A and 1B are vertical cross-sectional views illustrating a conventional planarization method for a semiconductor device when forming multiple-layer wiring.
Figure 1B:
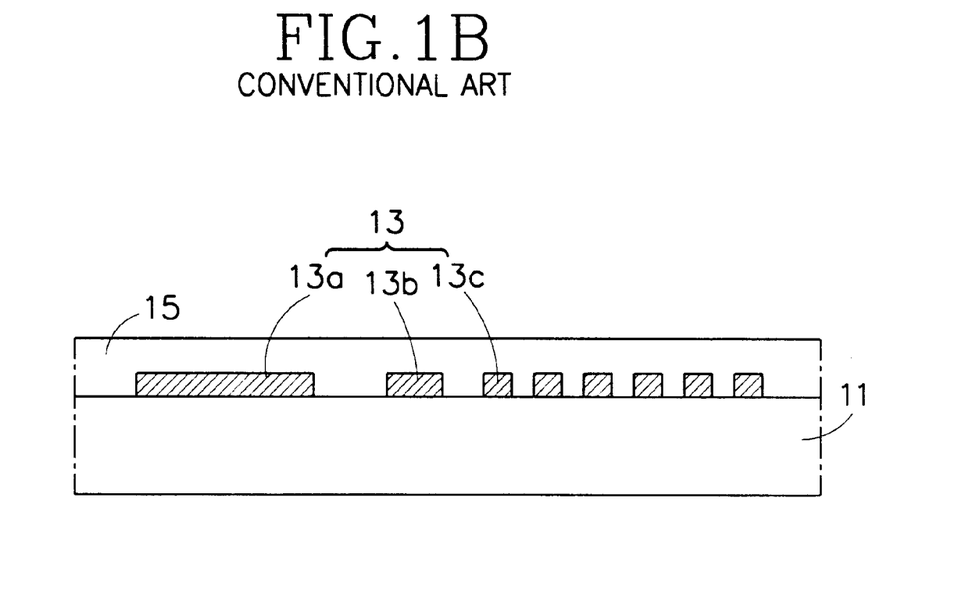

FIGS. 1A and 1B are vertical cross-sectional views illustrating a conventional planarization method for a semiconductor device when forming the multiple-layer metal wiring. As shown in FIG. 1A, a conductive layer is deposited on a substrate 11, and the conductive layer is patterned, forming conductive lines 13. An oxidation film 15 is then deposited over the substrate 11 and the conductive lines 13 by using the HDP CVD method. Next, as shown in FIG. 1B, an upper surface of the oxidation film 15 is polished by using the CMP method, flattening the upper surface of the oxidation film 15.

The above method for depositing the oxidation film 15 by using the HDP CVD method has excellent hygroscopicity and is capable of filling in any gaps. However, since an additional step such as the CMP, as shown in FIG. 1B, is needed in order to decrease global topological differences after depositing the oxidation film 15, the manufacturing process of a semiconductor device becomes more complex and manufacturing cost increases.

Generally, when depositing and forming the oxidation film 15 by using the HDP CVD method, a DC bias or an RF bias, or a combination of the DC and RF biases is applied to a susceptor of a plasma etching reactor wherein a wafer is placed, which is different from the CVD method, so that deposition and sputtering can occur simultaneously. A sputtering effect exists, however, such that an etch rate of a surface slanted at 45 degrees to an incident ion is 3–4 times higher than that of a vertical surface, as shown in FIG. 1A. A lozenge-shaped portion 15a of oxidation film 15 is formed over a conductive line 13a with a width of approximately 2.0 μm. The thickness of the lozenge-shaped portion of the oxidation film 15 is approximately the same as that of the oxidation film 15 formed over a region with no conductive lines 13. The oxidation film 15 fills in any gaps between the conductive lines 13. For example, if an oxidation film with a thickness of more than approximately 2.0 μm is formed on a conductive line having a width greater than 2.0 μm, a problem arises in that the lozenge-shaped oxidation film has a continuous flat shape. However, if the oxidation film 15 is formed over a conductive line 13b having a width of less than approximately 2.0 μm, a small triangle-shaped profile 15b is formed. The height of the triangle becomes less as the ratio of deposition/sputtering rates is decreased, or the deposition thickness is increased, or the line width becomes narrower. If the line width is approximately 1.2 μm, the ratio of the deposition/sputtering rates is approximately 3.2, and the oxidation film having a thickness of approximately 1.6 μm is deposited by using the HDP CVD method, the triangle-shaped profile 15b almost disappears. When the oxidation film 15 is formed over a conductive line 13c, which has a width of less than approximately 2.0 μm, as shown in FIG. 1A, the oxidation film 15 formed over the conductive line 13c becomes flattened and is almost level with the oxidation film 15 formed over the region having no conductive lines 13.

When the interval between the metal lines is greater than approximately 0.2 μm, the thickness of an oxidation film deposited between the conductive lines 13 becomes substantially identical. This important phenomenon, obtained when depositing the oxidation film by using the HDP CVD method, can also be obtained by depositing and etching by a plasma CVD method. In addition, although the depositing method of the oxidation film 15 depends on the properties of the HDP CVD method, the phenomenon is not limited to the oxidation film.

SUMMARY OF THE INVENTION

An object of the present invention is to provide a planarization method for a semiconductor device that substantially obviates the problems and limitations of the related art.

Additional features and advantages of the present invention will be set forth in the description which follows, and will be apparent from the description, or may be learned by practice of the invention. The objectives and other advantages of the invention will be realized and attained by the structure and process particularly pointed out in the written description as well as in the appended claims.

To achieve these and other advantages and in accordance with the purpose of the present invention, as embodied and broadly described, in one aspect of the present invention there is provided a method of forming a semiconductor device including forming a planarization layer over the substrate, forming a first line pattern having a first width on the planarization layer, forming a first insulating layer over the first line pattern and the planarization layer, and forming a second line pattern having the second width over the first line pattern and the first insulating layer, wherein the first width is smaller than the second width.

In another aspect of the present invention there is provided a method of planarizing a multilayer semiconductor wiring structure including the steps of forming a planarization layer on a substrate, forming a first conductive line pattern over the planarization layer, forming an insulation layer over the first conductive line pattern and the planarization layer, and forming a second conductive line pattern over the insulation layer, over portions of the first conductive line pattern, and selectively in contact with the first conductive layer.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention that together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

When an interval between the metal lines is greater than approximately 0.2 $\mu$m, a thickness of an oxidation film deposited between conductive lines becomes substantially identical. This important phenomenon, obtained when depositing the oxidation film by using the HDP CVD method, can also be obtained by depositing and etching by a plasma CVD method. Although the depositing method of an oxidation film depends on the properties of the HDP CVD method, the phenomenon is not limited to the oxidation film.

The minimum line width of a line pattern should be the minimum width allowed by the manufacturing process, and a maximum line width should be less than approximately 2.0 $\mu$m, although the maximum line width will vary according to a depositing condition of the HDP CVD oxidation film. As the ratio of deposition/sputtering rates is decreased, the deposition thickness is increased, the metal wiring width becomes narrower, the above deposition condition improves. It is desirable that the ratio of the deposition/sputtering rates be less than approximately 3.2.

FIGS. 2A through 2E are sequential vertical cross-sectional views illustrating a first embodiment of a multiple-layer wiring forming method of the present invention.

Figure 2A:
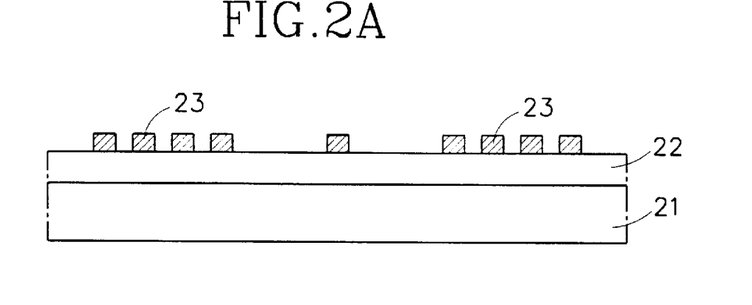
FIGS. 2A through 2E are sequential vertical cross-sectional views illustrating a multiple-layer wiring planarized according to a first embodiment of the present invention.

As shown in FIG. 2A, a planarization insulation film 22 is formed on a substrate 21, a conductive layer of an alloy of Al—Cu is deposited thereon having a thickness of approximately 0.5–0.8 $\mu$m, and the conductive layer is patterned forming first conductive lines 23. The first conductive lines 23 exhibit the following characteristics.

1) The minimum line width of the first conductive lines 23 is determined by the manufacturing process employed, and the maximum line with is less than approximately 2.0 $\mu$m.

Figure 3:
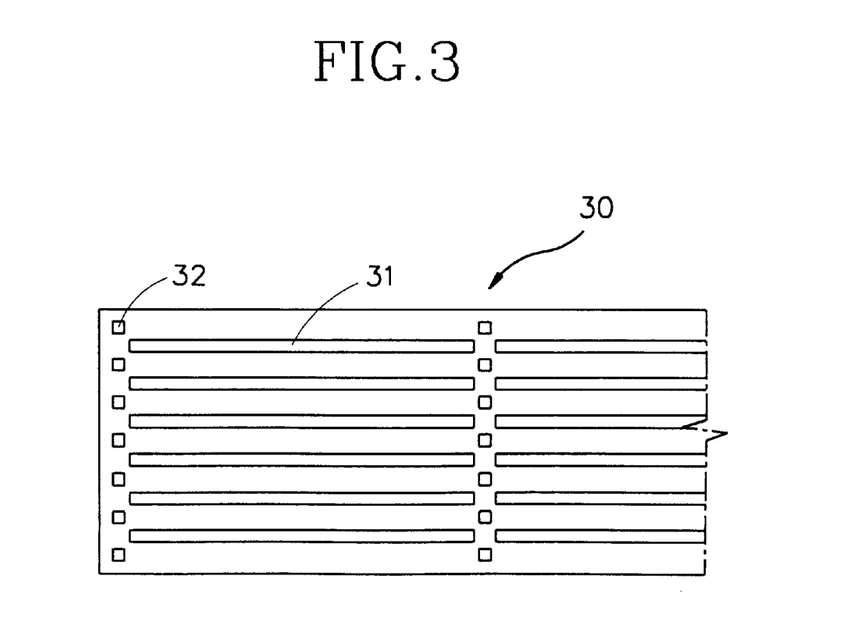
FIG. 3 is a plan view of the multiple-layer the multiple-layer wiring with a plurality of holes formed therein illustrating the first embodiment of the present invention.

2) If the width of line required is more than approximately 2.0 $\mu$m (such as, for example, power lines, or some signal lines), as shown in FIG. 3, a plurality of holes 31, 32 are formed in a metal line 30 to reduce the line width.

Figure 4:
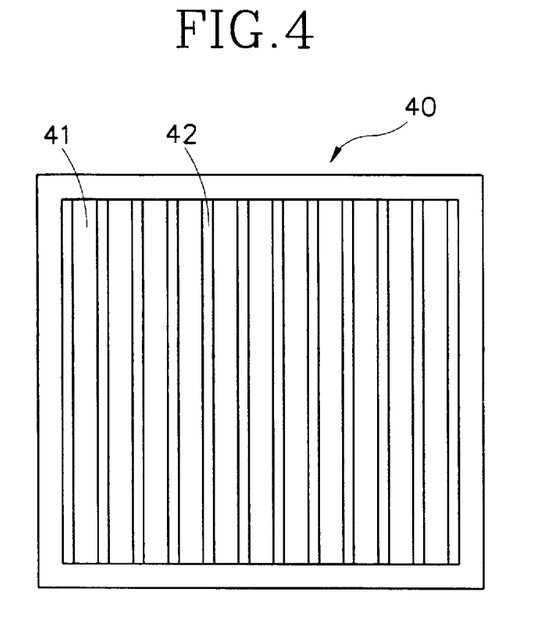
FIG. 4 is a plan view of a pad with a plurality of long holes formed therein according to the first embodiment of the present invention.
Figure 5:
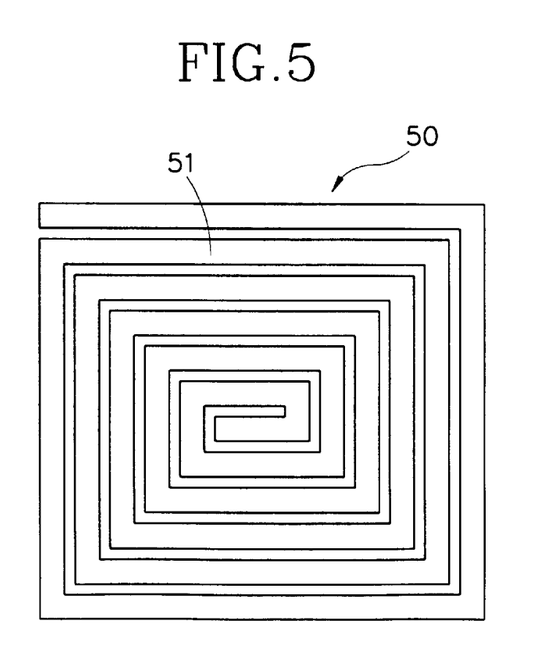
FIG. 5 is a plan view of a spiral square pad according to the first embodiment of the present invention.

3) If a square pad 40 with a side length of approximately 80–100 $\mu$m is required, as shown in FIG. 4, a plurality of long holes 41 are formed in the square pad 40, thereby forming a line pattern 42. Alternatively, a spiral line pattern 51 having a narrow line width can be formed, resulting in a square pad 50, as shown in FIG. 5.

Figure 2B:
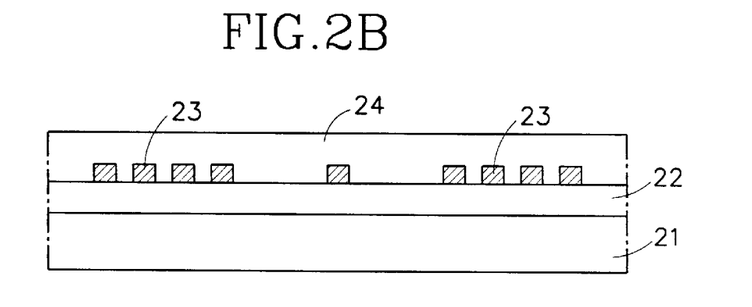

As shown in FIG. 2B, after an oxidation film 24 having a thickness of 1.0–2.0 $\mu$m is placed over a pattern of the first conductive lines 23 by using the HDP CVD method, a flat oxidation film 24 can be obtained. In general, the oxidation film 24 usually has no global topological differences due to the deposition phenomenon of the HDP CVD oxidation film described above. The high density plasma (HDP) is composed of a gas mixture including $SiH_4$, $O_2$, $CH_4$, $C_2F_6$, or $NF_3$, and the plasma density is greater than $10^{10}$ $cm^{-3}$. The HDP CVD method can be carried out by using an inductively coupled plasma (ICP) reactor, an electron cyclotron resonance (ECR) reactor, or a helicon plasma reactor. The bias applied to the susceptor of the plasma reactor can be a DC bias, an RF bias, or a combination of the DC and RF biases. It is desirable that the DC bias be applied at approximately −100 to −1500 V and the RF bias be applied at approximately 500 to 400 V.

Figure 2C:
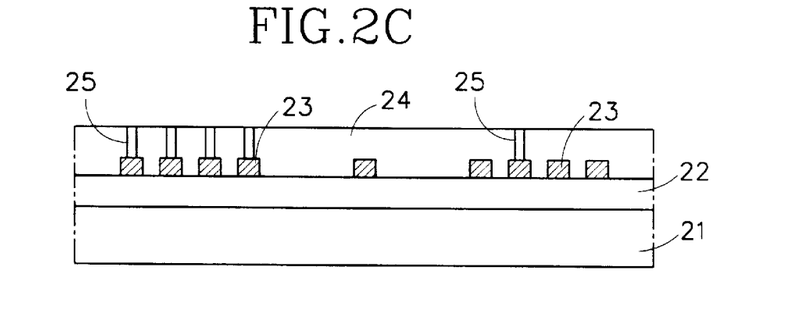
Figure 2D:
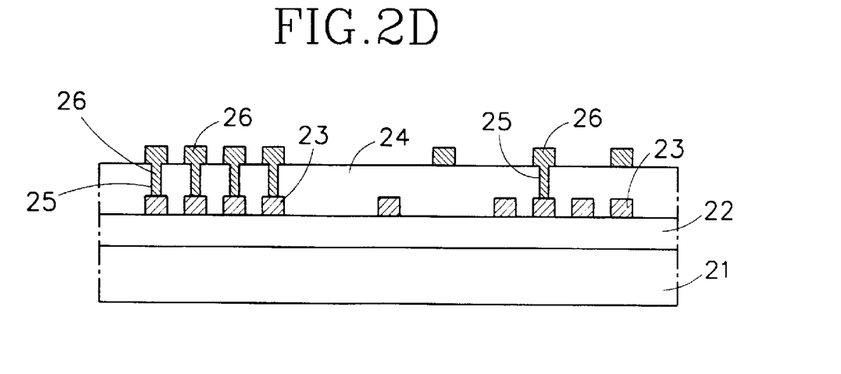

As shown in FIG. 2C, holes 25 are formed in the oxidation film 24, so that a portion of an upper surface of each of the corresponding first conductive lines 23 is externally exposed. As shown in FIG. 2D, a pattern of second conductive lines 26 are then formed on the oxidation film 24 at the same location as the pattern of the first conductive lines 23.

Here, a conductive material of the second conductive lines 26 fills in the holes 25, electrically connecting the first conductive lines 23 and the corresponding second conductive lines 26.

Figure 2E:
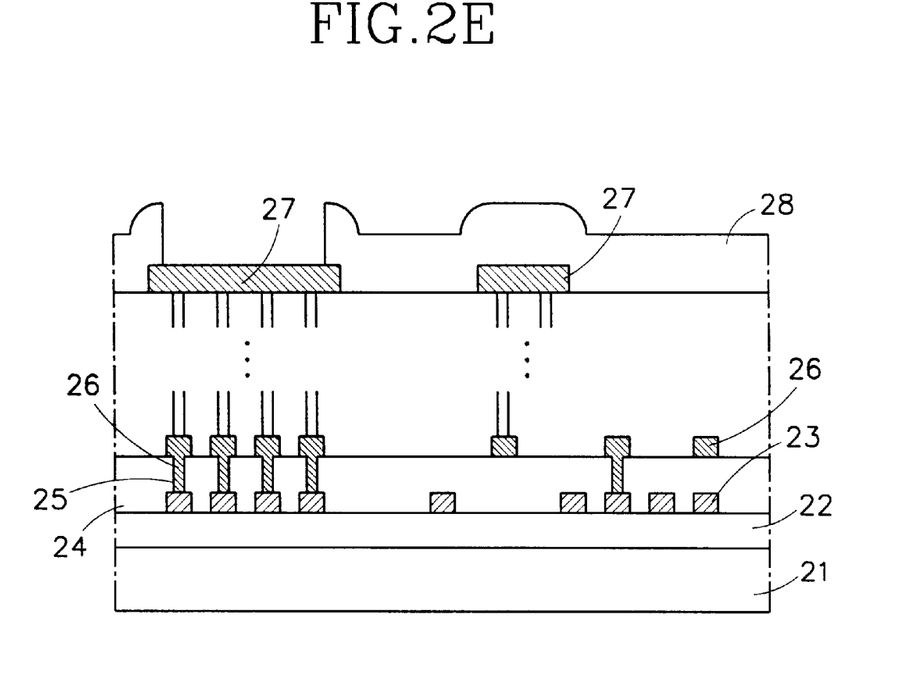

As shown in FIG. 2E, a multiple-layer metal wiring is then formed by repeatedly performing the steps shown in FIGS. 1A to 1D. Final conductive lines 27, formed before depositing a passivation insulation film 28, can be formed with no restrictions on their line widths. However, a square pad should be formed having a length of one side of approximately 80–100 $\mu$m. The passivation insulation film 28 is then deposited on the structure and a portion of the passivation insulation film 28 over the pad is removed so that an upper surface of the pad is exposed.

FIGS. 6A through 6F are sequential vertical cross-sectional views illustrating a second embodiment of the multiple-layer planarization method of the present invention.

Figure 6A:
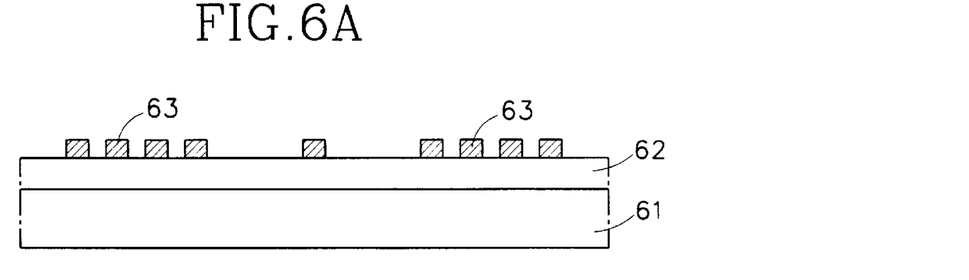
FIGS. 6A through 6F are sequential vertical cross-sectional views according to a second embodiment of the present invention.

As shown in FIG. 6A, a planarization insulation film 62 is formed on a substrate 61, a conductive layer, including an alloy of Al—Cu, is deposited over the insulation film 62 having a thickness of approximately 0.5–0.8 $\mu$m, and the conductive layer is patterned, forming first conductive lines 63. The first conductive lines 63 have the following characteristics:

1) The minimum line width of the first conductive lines 63 is the minimum width allowed by the manufacturing process, and the maximum line width is less than approximately 2.0 $\mu$m.

2) If the line width requires more than approximately 2.0 $\mu$m (such as, for example, a power line, or some signal lines), a plurality of holes are formed in the conductive lines 63 to reduce the line width, similar to that of the first embodiment illustrated in FIG. 3.

3) If a square pad, with a side length of approximately 80–100 $\mu$m is required, a plurality of long holes are formed in the square pad, thereby forming a line pattern similar to that of the first embodiment as shown in FIG. 4. Alternatively, a spiral line pattern, having a narrow line width can be formed, resulting in a square pad similar to that of the first embodiment as shown in FIG. 5.

Figure 6B:
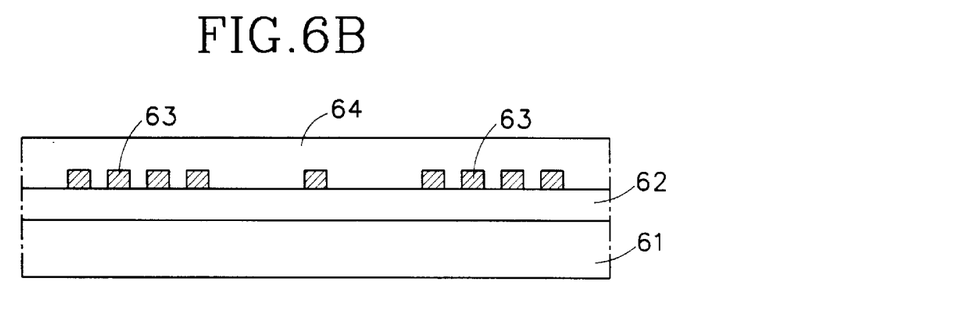
Figure 6C:
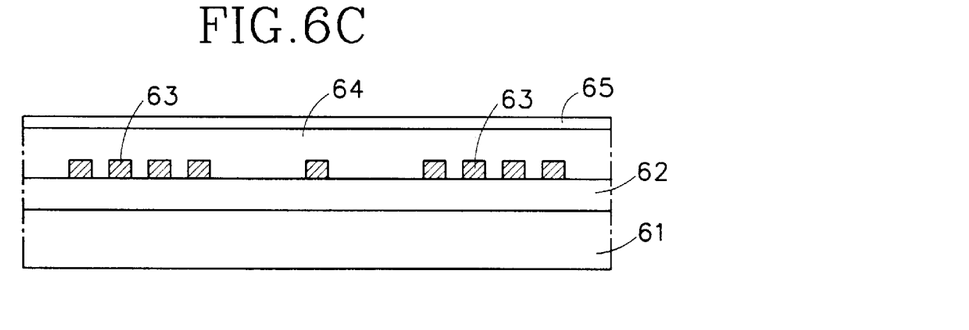

As shown in FIG. 6B, a first insulation film 64 is the deposited over a pattern of the first conductive lines 63 having a thickness of approximately 1.0–2.0 $\mu$m by using the HDP CVD method. As shown in FIG. 6C, an inorganic, organic, spin-on-glass (SOG), or a polymer film is deposited on the first insulation film 64 by a spin application method, forming a second insulation film 65. The second insulation film 65 can also be formed of a polymer by the spin application method. The high density plasma HDP is composed of a gas mixture including $SiH_4$, $O_2$, $CH_4$, $C_2F_6$, or $NF_3$, with a density greater than $10^{10}$ cm$^{-3}$. The HDP CVD method can be carried out by using an inductively coupled plasma (ICP) reactor, an electron cyclotron resonance (ECR) reactor, or a helicon plasma reactor. A bias applied to a susceptor of the plasma reactor can be a DC bias, an RF bias, or a combination of the DC and RF biases. It is preferable that the DC bias be approximately −100 to −1500V, and the RF bias be approximately 500 to 400V.

Figure 6D:
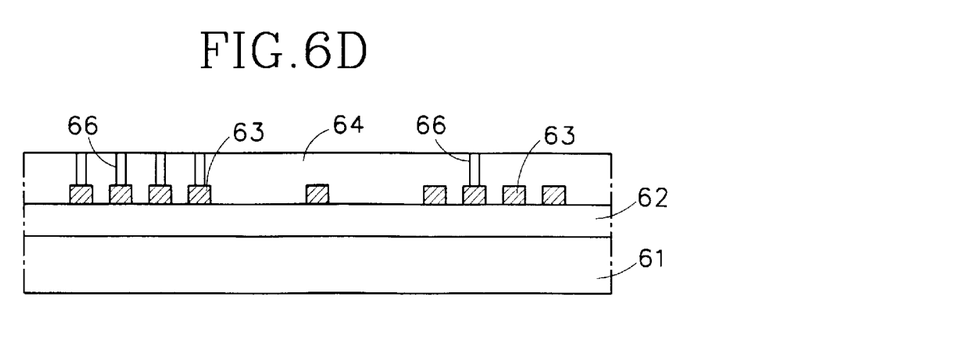

As shown in FIG. 6D, an etchback is performed on the second insulation film 65 by using a gas mixture including $CF_4$, $CHF_3$, $C_2F_6$, and $O_2$, and then holes 66 are formed so that a portion of an upper surface of the first conductive lines 63 is exposed.

Figure 6E:
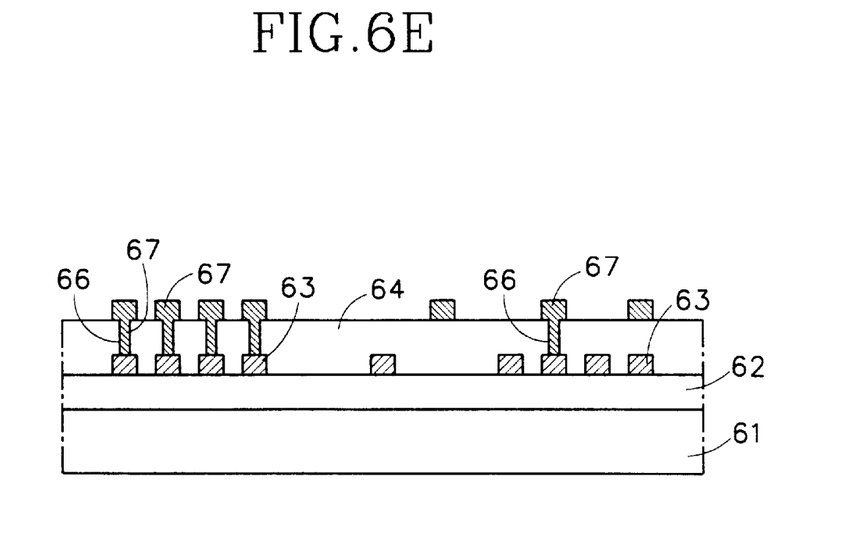
Figure 6F:
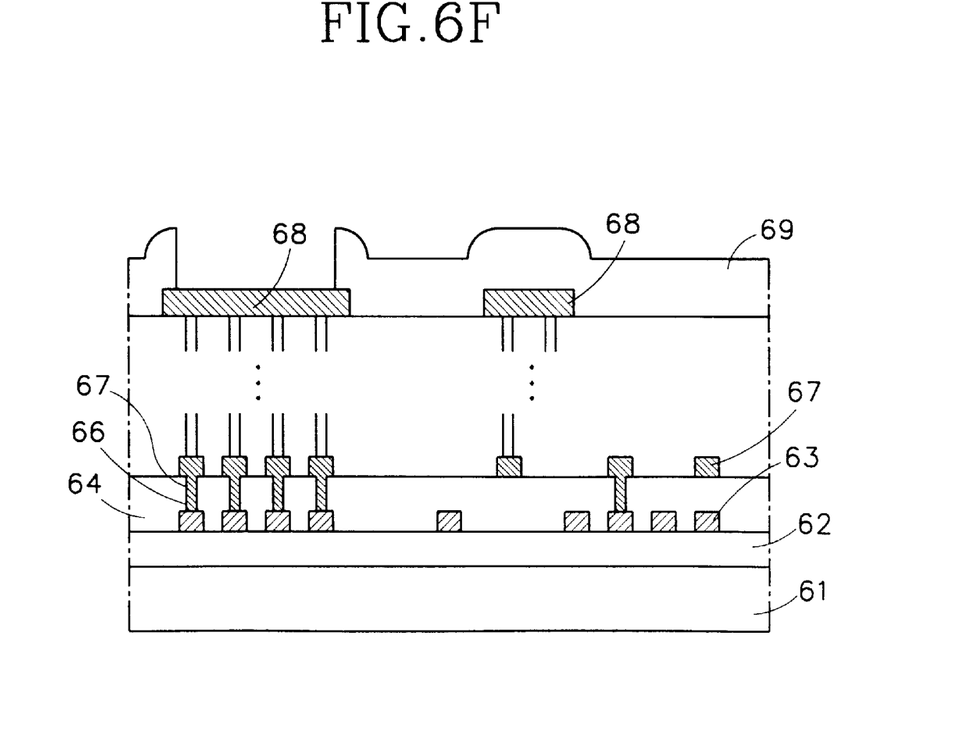

As shown in FIG. 6E, a pattern of a second conductive lines 67 is then formed on the first insulation film 64 on top of the pattern of the first conductive lines 63. Then, as shown in FIG. 6F, a multiple-layer metal wiring structure is formed by repeating the steps illustrated in FIGS. 6A to 6F. Finally, conductive lines 68 are formed before a passivation insulation film 69 is deposited, so that there is no restrictions on their width. However, a square pad should be formed with a side of approximately 80–100 $\mu$m long. The passivation insulation film 69 is then deposited thereon and then the passivation insulation film 69 over the pad is removed, so that an upper surface of the pad is exposed.

FIGS. 7A through 7F are sequential vertical cross-sectional views illustrating a third embodiment of the multiple-layer wiring forming method of the present invention.

Figure 7A:
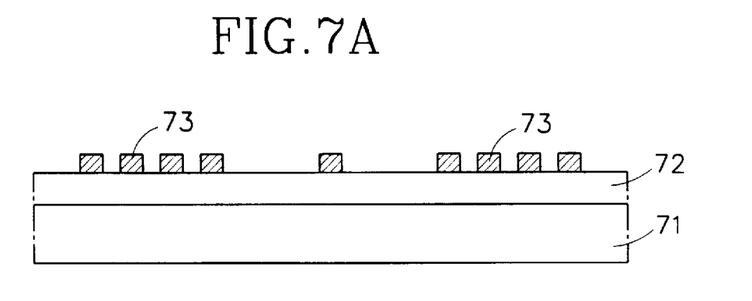
FIGS. 7A through 7F are sequential vertical cross-sectional views according to a third embodiment of the present invention.

As shown in FIG. 7A, a planarization insulation film 72 is formed on a substrate 71, a conductive layer, including an alloy of Al—Cu, is deposited thereon having a thickness of approximately 0.5–0.8 $\mu$m, and the conductive layer is patterned, forming first conductive lines 73. A pattern of the first conductive lines 73 has the following characteristics:

1) The minimum line width of the first conductive lines 73 is determined upon by the manufacturing process, and the maximum line width is less than approximately 2.0 $\mu$m.

2) If the line width requires more than approximately 2.0 $\mu$m (such as, for example, a power line, or some signal lines), a plurality of holes are formed in the conductive lines 73 to reduce the line width, similar to that of the first embodiment illustrated in FIG. 3.

3) If a square pad, with a side length of approximately 80–100 $\mu$m is required, a plurality of long holes are formed in the square pad, thereby forming a line pattern similar to that of the first embodiment as shown in FIG. 4. Alternatively, a spiral line pattern, having a narrow line width can be formed, resulting in a square pad similar to that of the first embodiment as shown in FIG. 5.

Figure 7B:
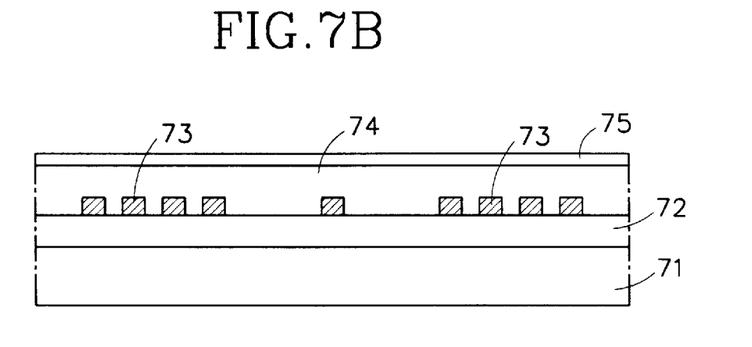

As shown in FIG. 7B, an oxidation film 74 having a thickness of approximately 1.0–2.0 $\mu$m is deposited over the pattern of the first conductive lines 73 by using the HDP CVD method, forming a first insulation film 74. A second insulation film 75 is formed on the first insulation film 74, by using a conventional RF CVD method, having a thickness of approximately 0.2–0.5 $\mu$m. A plasma including a gas mixture of $SiH_4$, $O_2$, $CH_4$, $C_2F_6$, and $NF_3$ is used to form the first insulation film 74. The density of the plasma is greater than $10^{10}$ cm$^{-3}$. The HDP CVD method can be carried out by using an inductively coupled plasma (ICP) reactor, an electron cyclotron resonance (ECR) reactor, or a helicon plasma reactor. A bias applied to the susceptor of the plasma reactor can be a DC bias, an RF bias, or a combination of the DC and RF biases. It is desirable that the DC bias be applied at approximately −100 to −1500V and the RF bias be at approximately 500 to 400V.

Figure 7C:
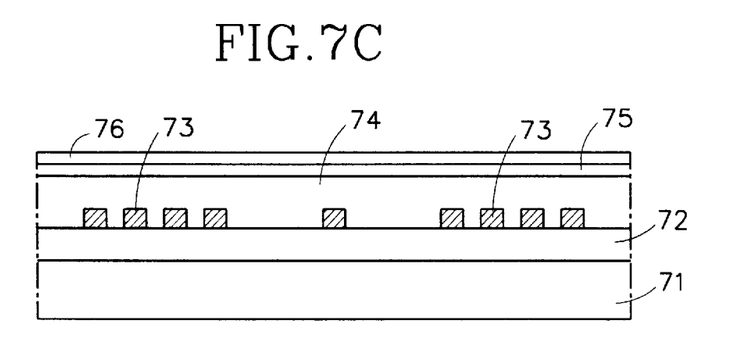
Figure 7D:
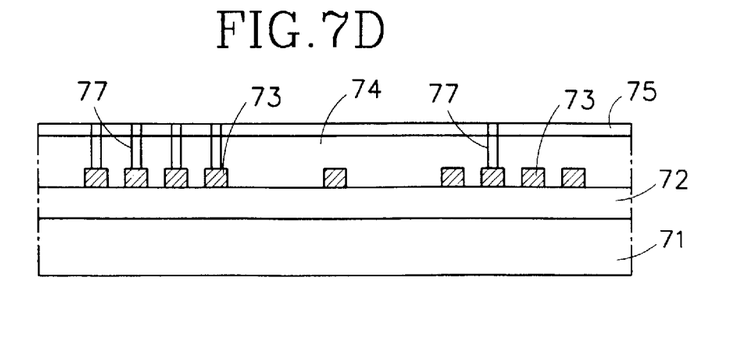

As shown in FIG. 7C, an inorganic, organic, spin-on-glass (SOG), or a polymer film is deposited on the second insulation film 75 by a spin application method, forming a third insulation film 76. As shown in FIG. 7D, an etchback is then performed on the third insulation film 76 by using a gas mixture that includes $CF_4$, $CHF_3$, $C_2F_6$ and $O_2$, and then holes 77 are formed in the second insulation film 75 and the first insulation film 74, so that a portion of an upper surface of the first conductive lines 73 is exposed.

Figure 7E:
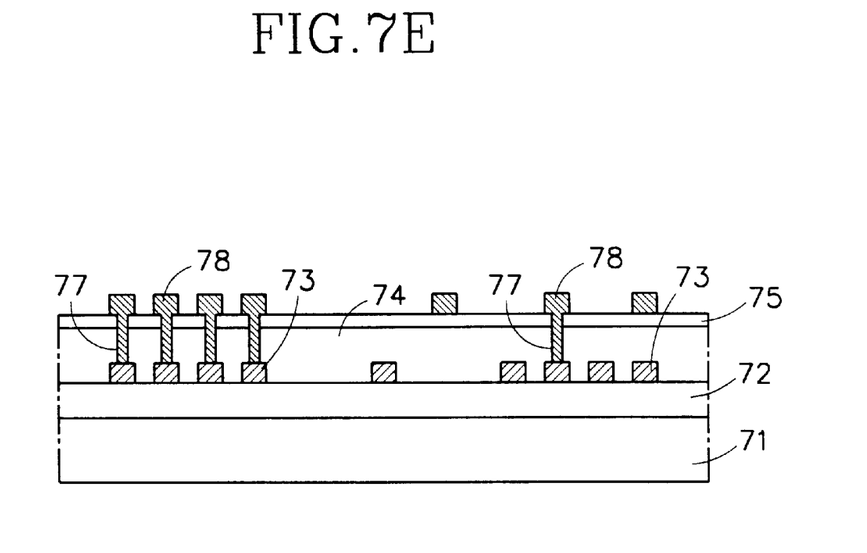
Figure 7F:
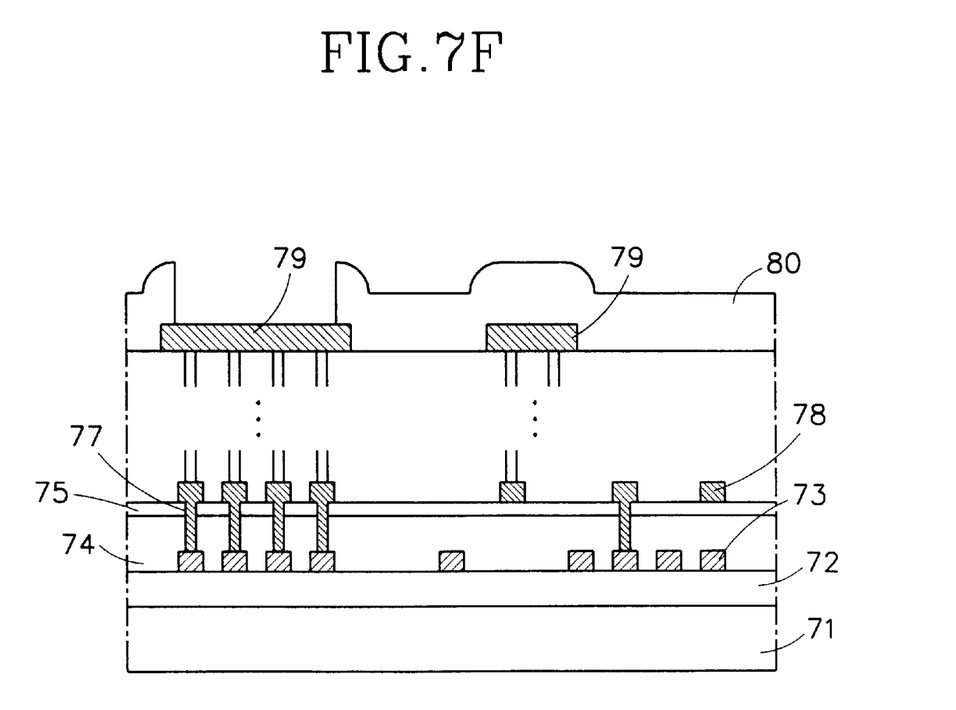

As shown in FIG. 7E, a pattern of second conductive lines 78 is then formed on the second insulation film 75 over the first conductive lines 73. A multiple-layer wiring is formed, as shown in FIG. 7F, by repeating the above steps as many times as necessary. Finally, conductive lines 79, formed before a passivation insulation film 80 deposited, can be formed with no restrictions on their widths. However, a square pad should be formed with one side approximately 80–100 μm, before the passivation insulation film 80 is deposited thereon and is removed, so that an upper surface of the pad is externally open.

As described above, the planarization method of the semiconductor device according to the present invention is capable of filling in submicron gaps between the metal lines without leaving voids by only using the HDP CVD oxidation film deposition or oxidation film deposition, and the etchback process, without any CMP steps. In addition, the method of the present invention improves local and global flatness almost to the same extent as the CMP method. Thereby simplifying the semiconductor manufacturing process so that manufacturing cost is reduced, and improvements in semiconductor device yield can be obtained.

While the invention has been described in detail and with reference to specific embodiments thereof, it will be apparent to those skilled in the art that various changes and modifications can be made therein without departing from the spirit and scope thereof. Thus, it is intended that the present invention cover the modifications and variations of this invention provided they come within the scope of the appended claims and their equivalents.

What is claimed is:

1. A method of planarizing a multilayer semiconductor wiring structure, comprising the steps of:
   forming a planarization layer on a substrate;
   forming a first conductive line pattern over the planarization layer including conductive lines having a width of less than approximately 2 μm;
   forming a first insulation layer over the first conductive line pattern and the planarization layer by using a high density plasma chemical vapor deposition process; and
   forming a second conductive line pattern over the first insulation layer, wherein the second conductive line pattern is over the first conductive line pattern and has portions in contact with the first conductive line pattern, and
   wherein the second conductive line pattern includes conductive lines having a width of less than approximately 2 μm.

2. The method of claim 1, wherein the step of forming the first insulation layer by using a high density plasma chemical vapor deposition process uses a plasma having a density of at least $10^{10}$ $cm^3$.

3. The method of claim 1, wherein the step of forming the first insulation layer by using a high density plasma chemical vapor deposition process has a deposition rate to a sputtering rate ratio of less than approximately 3.2.

4. The method of claim 1, wherein the step of forming the first insulation layer by using a high density plasma chemical vapor deposition process uses a gas mixture including $SiH_4$, $O_2$, $CH_4$, $C_2F_6$, and $NF_3$ as a plasma source.

5. The method of claim 1, wherein the step of forming the first insulation layer by using a high density plasma chemical vapor deposition process further includes the step of biasing a susceptor of a plasma reactor with one of a DC bias, an RF bias, or a combination of the DC and RF biases.

6. The method of claim 1, wherein the step of forming the first insulation layer by using a high density plasma chemical vapor deposition process is performed by an inductively coupled plasma (ICP) reactor, an electron cyclotron resonance (ECR) reactor, or a helicon plasma reactor.

7. The method of claim 1, wherein, in the step of forming a first conductive line pattern, conductive lines are formed of an aluminum alloy.

8. The method of claim 7, wherein, in the step of forming a first conductive line pattern, the conductive line pattern is formed of Al—Cu having a thickness of approximately 0.5–0.8 μm.

9. The method of claim 1, further including the step of:
   forming a passivation layer over the second conductive line pattern.

10. The method of claim 9, further including the step of:
    selectively etching the passivation layer.

11. The method of claim 1, wherein the step of forming the second conductive line pattern includes the step of:
    forming holes in the first insulation layer and selectively exposing portions of a top surface of the first conductive line pattern.

12. The method of claim 11, wherein the step of forming the second conductive line pattern includes the step of:
    forming the second conductive line pattern having the portions in contact with the first conductive line pattern through the holes in the first insulation layer and filling in the holes with a conductive material.

13. The method of claim 1, further including the steps of:
    forming a second insulation layer over the first insulation layer through a spin application method prior to the step of forming the second conductive line pattern, wherein the second insulation layer comprises a film material selected from a group consisting of an organic material, an inorganic material, a spin-on-glass, or a polymer;
    forming a third insulation layer over the second insulation layer; and
    etching back the third insulation layer.

14. The method of claim 13, wherein in the step of etching back the third insulation layer etching of the upper surface of the insulation layer is performed by a gas mixture including at least one of $CF_4$, $CHF_3$, $C_2F_6$, and $O_2$.

15. The method of claim 1, wherein, in the step of forming a first conductive line pattern, conductive lines are formed having a thickness of between 0.5 and 0.8 μm.

16. The method of claim 1, wherein the step of forming the first insulation layer includes the step of:
    forming an oxide layer.

17. The method of claim 1, further including the steps of:
    forming a second insulation layer over the first insulation layer from an organic material, an inorganic material, a spin-on-glass, or a polymer through a spin application method; and etching back the second insulation layer.

18. The method of claim 1, wherein the steps of forming the first and second conductive line patterns include the steps of:

forming conductive lines from an aluminum alloy.

19. The method of claim 1, wherein the step of forming the first conductive line pattern on the planarization layer includes the step of:

forming lines having a width of less than 2.0 $\mu$m.

20. The method of claim 1, wherein the step of forming the planarization layer on the substrate includes the step of:

forming a non-conductive layer.

21. The method of claim 1, wherein the step of forming the planarization layer on the substrate includes the step of:

forming a layer having a thickness of approximately 1.5–2.0 $\mu$m.

22. The method of claim 1, wherein the step of forming a planarization layer on a substrate further includes the step of forming an oxidation film.

23. The method of claim 1, wherein, in the steps of forming the first and second conducive line patterns, the first and second conductive line patterns are formed having a thickness of 0.5–0.8 $\mu$m.

24. The method of claim 1, wherein, in the step of forming the first insulation layer, the first insulation layer is formed having a thickness of approximately 0.2–0.5 $\mu$m.

25. The method of claim 1, wherein the step of forming a first insulation layer by using high density plasma chemical vapor deposition process uses a gas mixture including $SiH_4$, $O_2$, $CH_4$, and $NF_3$ as a plasma source.

26. The method of claim 1, wherein the conductive lines are parallel.

27. A method of planarizing a multilayer semiconductor wiring structure. comprising the steps of:

forming a planarization layer on a substrate;

forming a first conductive line pattern over the planarization layer including conductive lines having a width of less than approximately 2 $\mu$m;

forming a first insulation layer over the first conductive line pattern and the planarization layer by using a high density plasma chemical vapor deposition process; and forming a second conductive line pattern over the first insulation layer, wherein the second conductive line pattern is over the first conductive line pattern and has portions in contact with the first conductive line pattern, wherein the conductive lines form a spiral with a generally square shape.

* * * * *

UNITED STATES PATENT AND TRADEMARK OFFICE
CERTIFICATE OF CORRECTION

PATENT NO. : 6,117,787
DATED : September 12, 2000
INVENTOR(S) : Park

It is certified that error appears in the above-identified patent and that said Letters Patent is hereby corrected as shown below:

Column 7, line 62, change "$cm^3$" to --$cm^{-3}$--

Signed and Sealed this

First Day of May, 2001

NICHOLAS P. GODICI

*Attest:*

*Attesting Officer*     *Acting Director of the United States Patent and Trademark Office*